United States Patent
Hung

(10) Patent No.: US 10,128,380 B1
(45) Date of Patent: Nov. 13, 2018

(54) VERTICAL METAL OXIDE SEMICONDUCTOR TRANSISTOR AND FABRICATION METHOD THEREOF

(71) Applicant: UNITED MICROELECTRONICS CORP., Hsin-Chu (TW)

(72) Inventor: Ching-Wen Hung, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/726,392

(22) Filed: Oct. 6, 2017

(30) Foreign Application Priority Data

Sep. 12, 2017 (CN) .......................... 2017 1 0816267

(51) Int. Cl.
| | | |
|---|---|---|
| H01L 29/786 | (2006.01) | |
| H01L 29/66 | (2006.01) | |
| H01L 21/768 | (2006.01) | |
| H01L 23/535 | (2006.01) | |
| H01L 23/532 | (2006.01) | |
| H01L 29/06 | (2006.01) | |
| H01L 29/423 | (2006.01) | |

(52) U.S. Cl.
CPC .. *H01L 29/78642* (2013.01); *H01L 21/76805* (2013.01); *H01L 21/76829* (2013.01); *H01L 21/76843* (2013.01); *H01L 21/76889* (2013.01); *H01L 21/76895* (2013.01); *H01L 23/535* (2013.01); *H01L 23/53266* (2013.01); *H01L 29/0676* (2013.01); *H01L 29/42392* (2013.01); *H01L 29/66742* (2013.01); *H01L 29/78618* (2013.01); *H01L 29/78696* (2013.01)

(58) Field of Classification Search
CPC ......... H01L 29/78642; H01L 21/76805; H01L 21/76829; H01L 29/0676; H01L 29/42392; H01L 29/76818; H01L 29/78696
See application file for complete search history.

(56) References Cited

U.S. PATENT DOCUMENTS

| | | | |
|---|---|---|---|
| 9,728,466 B1* | 8/2017 | Mallela | H01L 21/82381 |
| 2007/0205450 A1* | 9/2007 | Okita | B82Y 10/00 |
| | | | 257/296 |
| 2014/0225184 A1 | 8/2014 | Colinge | |
| 2015/0372082 A1* | 12/2015 | Wu | H01L 21/8234 |
| | | | 257/9 |
| 2016/0181362 A1* | 6/2016 | Yang | H01L 29/0649 |
| | | | 257/329 |
| 2017/0005195 A1* | 1/2017 | Ching | H01L 29/7848 |

\* cited by examiner

*Primary Examiner* — Walter H Swanson
(74) *Attorney, Agent, or Firm* — Winston Hsu

(57) ABSTRACT

A vertical MOS transistor includes a substrate having therein a first source/drain region and a first ILD layer. A nanowire is disposed in the first ILD layer. A lower end of the nanowire is in direct contact with the first source/drain region, and an upper end of the nanowire is coupled with a second source/drain region. The second source/drain region includes a conductive layer. A gate electrode is disposed in the first ILD layer. The gate electrode surrounds the nanowire. A contact hole is disposed in the first ILD layer. The contact hole exposes a portion of the first source/drain region. A contact plug is disposed in the contact hole. A second ILD layer covers the first ILD layer.

10 Claims, 9 Drawing Sheets

VERTICAL METAL OXIDE SEMICONDUCTOR TRANSISTOR AND FABRICATION METHOD THEREOF

CROSS REFERENCE TO RELATED APPLICATION

This application claims the priority from CN application No. 201710816267.1, filed Sep. 12, 2017, which is included in its entirety herein by reference.

BACKGROUND OF THE INVENTION

1. Field of the Invention

The present invention relates generally to the field of semiconductor technology. More particularly, the present invention relates to a vertical metal-oxide-semiconductor (MOS) transistor with a nanowire and a method for fabricating the same.

2. Description of the Prior Art

Vertical transistors are known in the art. In a vertical transistor, a vertical nanowire formed of a semiconductor material, is formed over a substrate, which may be a bulk semiconductor wafer or a semiconductor-on-insulator (SOI) wafer. A gate dielectric and a gate electrode are formed to encircle the nanowire, with the encircled portion of the nanowire forming the channel of the respective vertical transistor. A source and a drain are formed, with one underlying the channel, and the other overlying the channel. The vertical transistor has a gate-all-around structure since the gate may fully encircle the channel. With the all-around gate structure, the drive current of the vertical transistor is high and short-channel effects are minimized.

However, the conventional method for fabricating the vertical transistor with nanowire is too complicated. In addition, the process window is insufficient when the metal-on-diffusion (MD) contact hole is made. This is because the depth of the contact hole at the upper end of the nanowire is different from the depth of the contact hole at the source/drain region in the substrate.

SUMMARY OF THE INVENTION

The main object of the present invention is to provide an improved vertical metal-oxide-semiconductor (MOS) transistor which can solve the above-mentioned drawbacks and shortcomings of the prior art.

Another object of the present invention is to provide a method for manufacturing a vertical MOS transistor which can be compatible with the conventional Si FinFET process.

According to one embodiment of the invention, a method for fabricating a vertical MOS transistor is provided. A substrate having therein a first source/drain region and a first inter-layer dielectric (ILD) layer covering the first source/drain region is provided. An opening is formed in the first ILD layer so as to expose a portion of the first source/drain region. A nanowire is epitaxially grown in the opening. A top surface of the nanowire is recessed in the opening thereby forming a recess atop the nanowire. A contact hole is formed in the first ILD layer. The contact hole exposes a portion of the first source/drain region. A conductive layer is formed in the recess and a contact plug is formed in the contact hole. The conductive layer acts as a second source/drain region. The conductive layer is capped with a first mask layer and the contact plug is capped with a second mask layer. A top surface of the first mask layer, a top surface of the second mask layer, and a top surface of the first ILD layer are coplanar. A gate trench is formed in the first ILD layer surrounding the nanowire. A gate electrode is formed in the gate trench.

According to one aspect of the invention, a vertical MOS transistor includes a substrate having therein a first source/drain region and a first ILD layer. A nanowire is disposed in the first ILD layer. A lower end of the nanowire is in direct contact with the first source/drain region, and an upper end of the nanowire is coupled with a second source/drain region. The second source/drain region includes a conductive layer. A gate electrode is disposed in the first ILD layer. The gate electrode surrounds the nanowire. A contact hole is disposed in the first ILD layer. The contact hole exposes a portion of the first source/drain region. A contact plug is disposed in the contact hole. A second ILD layer covers the first ILD layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
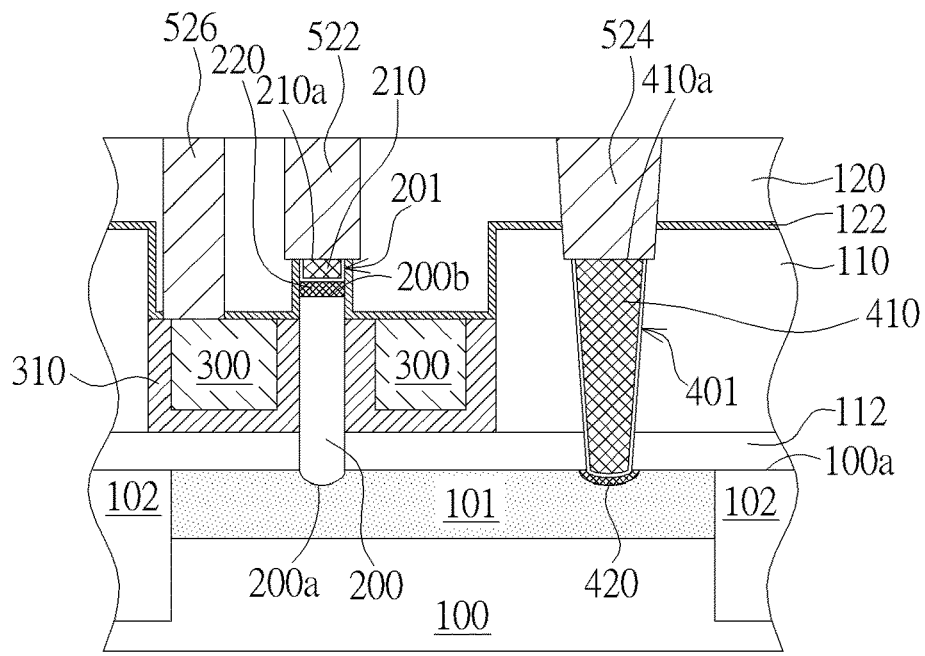
FIG. 1 is a schematic, cross-sectional view of a vertical metal-oxide-semiconductor (MOS) transistor according to an embodiment of the present invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

As described in the embodiments herein, steps such as deposition, patterning or etching of various films (including conductive films, metals, dielectric layers, etc.) can be accomplished using known processes such as chemical vapor deposition, physical vapor deposition, sputtering, atomic layer deposition, optical lithography processes, plasma dry etching, wet etching, reactive ion etching, and the like, the details of which will not be repeated.

Referring to FIG. 1, there is shown a schematic view of a vertical metal-oxide-semiconductor (MOS) transistor according to an embodiment of the present invention. As shown in FIG. 1, the vertical MOS transistor 1 comprises a substrate 100, such as a silicon substrate, a silicon-on-insulator (SOI) substrate, or any other semiconductor substrates. On the substrate 100 is provided a first source/drain region 101 and a trench insolation structure 102 surrounding the first source/drain region 101. According to an embodiment of the present invention, the first source/drain region 101 may be an $N^{++}$ heavily doped region, but is not limited thereto. The trench isolation structure 102 may be a shallow trench isolation (STI) structure.

According to an embodiment of the present invention, a first interlayer dielectric (ILD) layer 110, such as a silicon oxide layer, is provided on the main surface 100a of the substrate 100, covering the first source/drain region 101 and the trench isolation structure 102. According to an embodiment of the present invention, an etch stop layer 112, such as a silicon nitride layer, may be provided between the substrate 100 and the first ILD layer 110.

According to an embodiment of the present invention, a nanowire 200 is provided in the first ILD layer 110 and the etch stop layer 112. The lower end portion 200a of the nanowires 200 is in direct contact with the first source/drain region 101. An upper end portion 200b of the nanowires 200 is coupled to a second source/drain region 201 disposed in the first ILD layer 110. The second source/drain region 201 comprises a conductive layer 210 directly situated on the upper end portion 200b of the nanowire 200.

According to an embodiment of the present invention, the vertical MOS transistor 1 further comprises a gate electrode 300 disposed in the first ILD layer 110 and on the etch stop layer 112. The gate electrode 300 surrounds the nanowires 200 and is provided corresponding to a gate channel region of the nanowire 200. According to an embodiment of the present invention, the gate electrode 300 is located between the first source/drain region 101 and the second source/drain region 201 and continuously surrounds the nanowires 200 to form an all-around-gate (AAG) structure. The etch stop layer 112 is interposed between the gate electrode 300 and the first source/drain region 101 so that the gate electrode 300 is electrically insulated from the first source/drain region 101.

According to an embodiment of the present invention, the gate electrode 300 may comprise a plurality of layers of metal including, but not limited to, barrier layers, work function layers, low resistance metal layers, or the like. According to an embodiment of the present invention, a high dielectric constant (high-k) dielectric layer 310, such as a dielectric layer having a dielectric constant greater than 3.9, may be provided between the gate electrode 300 and the etch stop layer 112 and between the gate electrode 300 and the nanowire 200.

According to an embodiment of the present invention, in the first ILD layer 110, a contact hole 401 is provided adjacent to the nanowire 200. The contact hole 401 exposes a portion of the first source/drain region 101. A contact plug 410 is provided in the contact hole 401. The contact plug 410 has a top surface 410a which is flush with a top surface 210a of the conductive layer 210.

According to an embodiment of the present invention, a second interlayer dielectric (ILD) layer 120, such as a silicon oxide layer, is deposited on the first ILD layer 110. According to an embodiment of the present invention, a contact etch stop layer 122 may be provided between the first ILD layer 110 and the second ILD layer 120.

According to an embodiment of the present invention, the vertical MOS transistor 1 further comprises a first metal-on-diffusion (MD) contact element 522 provided in the second ILD layer 120 and the contact etch stop layer 122. The first MD contact element 522 is in direct contact with the conductive layer 210.

According to an embodiment of the present invention, the vertical MOS transistor 1 further comprises a second MD contact element 524 disposed in the second ILD layer 120, the contact etch stop layer 122, and the first ILD layer 110. The second MD contact element 524 is in direct contact with the contact plug 410.

According to an embodiment of the present invention, the vertical MOS transistor 1 further comprises a metal-on-poly (MP) contact element 526 disposed in the second ILD layer 120 and the contact etch stop layer 122. The MP contact element 526 is in direct contact with the gate electrode 300.

According to an embodiment of the present invention, the vertical MOS transistor 1 further comprises a first silicide layer 220 disposed between the conductive layer 210 and the nanowires 200. According to an embodiment of the present invention, the vertical MOS transistor 1 further comprises a second silicide layer 420 disposed between the contact plug 410 and the first source/drain region 101.

Figure 2:
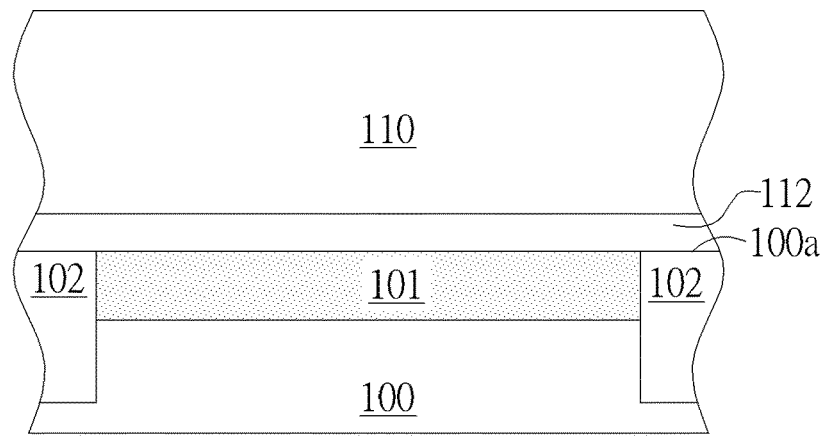
FIGS. 2 to 15 illustrate a method of manufacturing a vertical MOS transistor.

FIGS. 2 to 15 illustrate a method of manufacturing a vertical MOS transistor. First, as shown in FIG. 2, a substrate 100, such as a silicon substrate, a silicon-on-insulator (SOI) substrate, or any other semiconductor substrates is provided. On the substrate 100 is provided a first source/drain region 101 and a trench isolation structure 102 surrounding the first source/drain region 101. According to an embodiment of the present invention, the first source/drain region 101 may be an $N^{++}$ heavily doped region, but is not limited thereto.

Next, on the main surface 100a of the substrate 100, an etch stop layer 112, such as a silicon nitride layer, is deposited to cover the first source/drain region 101 and the trench isolation structure 102. A first interlayer dielectric (ILD) layer 110, such as a silicon oxide layer, is deposited on the etch stop layer 112.

Figure 3:
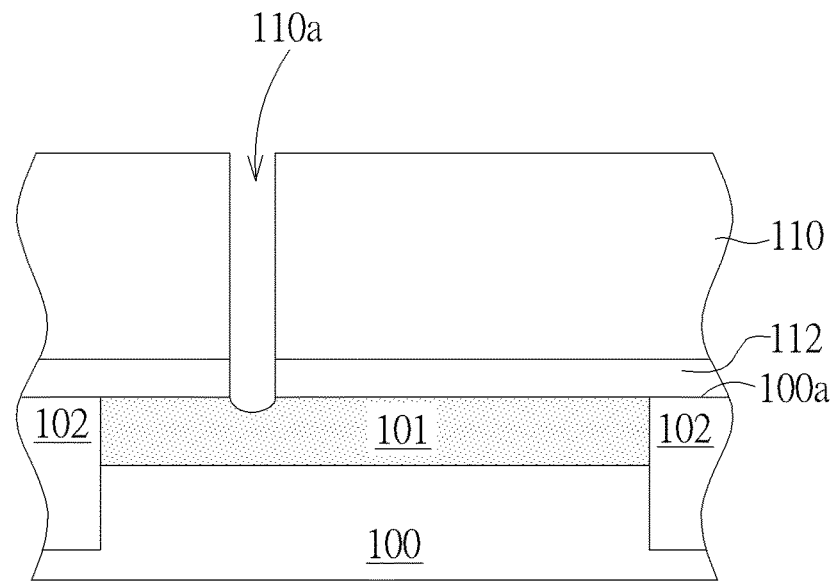
Figure 16:
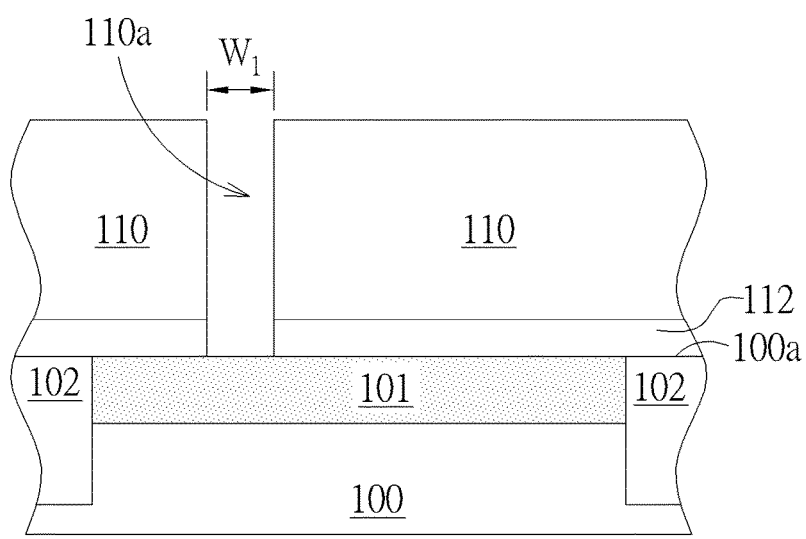
FIGS. 16 to 18 illustrate an embodiment of shrinking the width of the opening for a nanowire.
Figure 17:
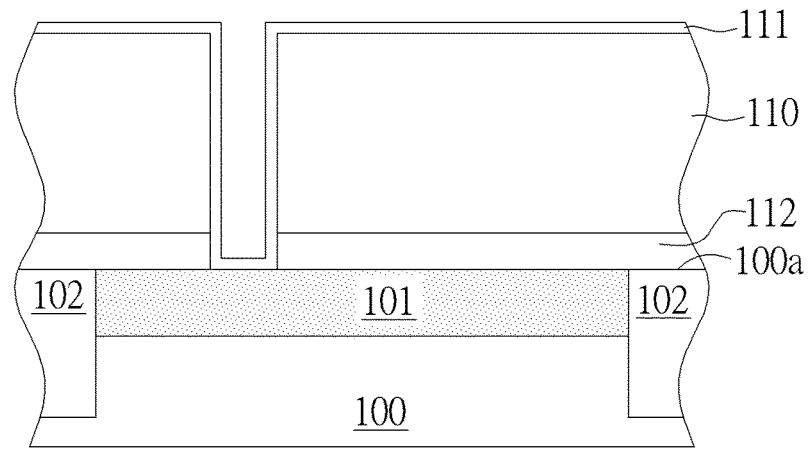
Figure 18:
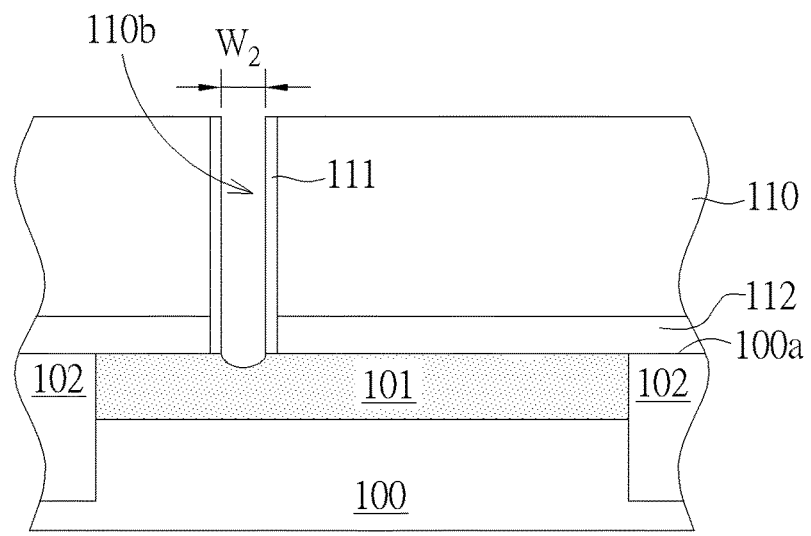

As shown in FIG. 3, an opening 110a is formed in the first ILD layer 110 and the etch stop layer 112, and the first source/drain region 101 is partially exposed. According to an embodiment of the present invention, optionally, referring to FIGS. 16 to 18, the width of the opening 110a may be reduced at this time. As shown in FIG. 16, an opening 110a having a width $W_1$ is formed in the first ILD layer 110 and the etch stop layer 112. As shown in FIG. 17, a thin film layer 111, for example, a silicon oxide layer, is conformally deposited on the first ILD layer 110 and in the opening 110a by atomic layer deposition. As shown in FIG. 18, the thin film layer 111 is subjected to anisotropic dry etching and an opening 110b having a width $W_2$ is formed.

Figure 4:
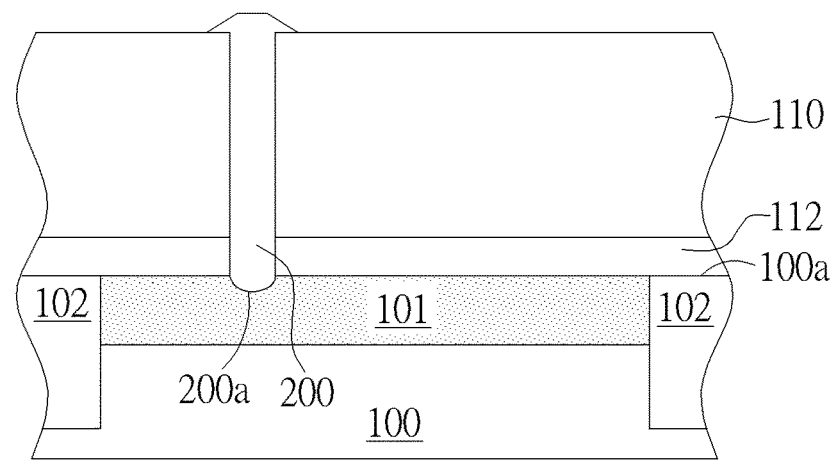

As shown in FIG. 4, a nanowire 200 is grown in an epitaxial manner in the opening 110a. The nanowires 200 may contain silicon, silicon germanium semiconductors, but is not limited thereto. According to an embodiment of the present invention, the lower end portion 200a of the nanowires 200 is in direct contact with the first source/drain region 101.

Figure 5:
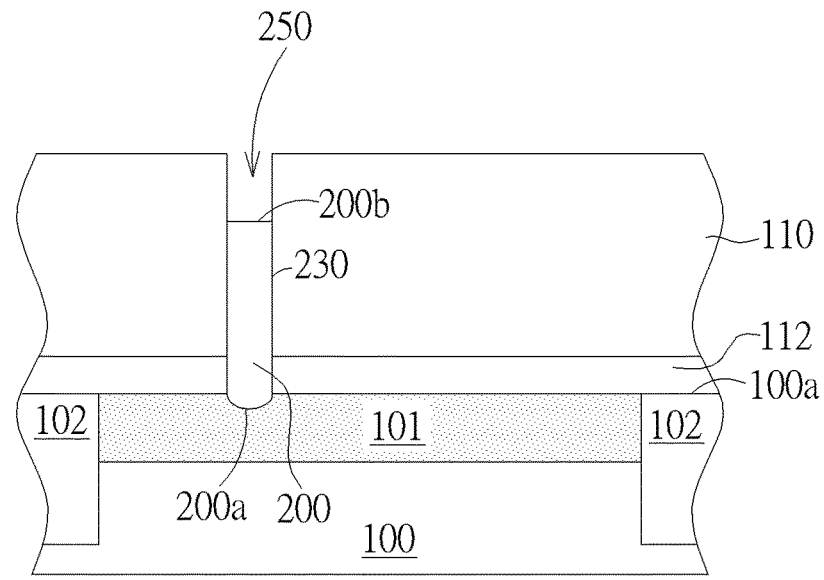

As shown in FIG. 5, an etching process is performed to recess an upper end portion 200b of the nanowire 200 into the opening 110a, thereby forming a recess 250 atop the nanowires 200.

Figure 6:
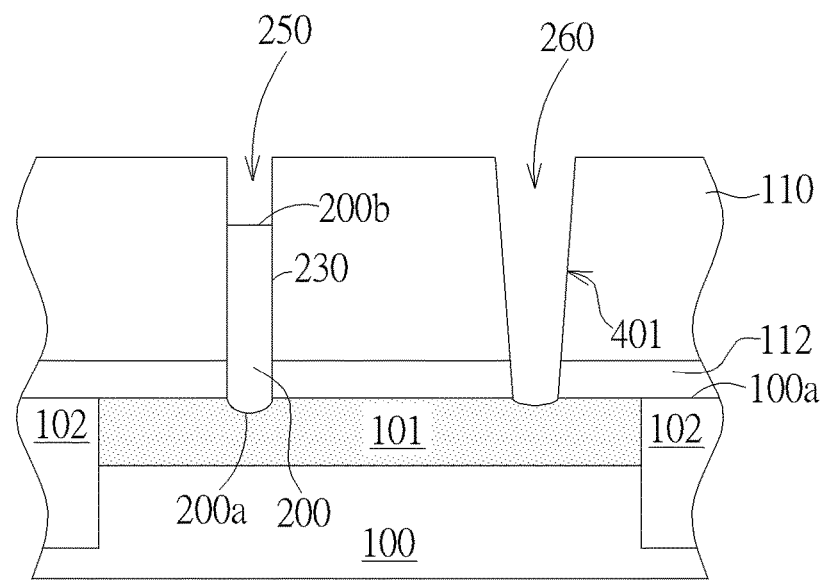

As shown in FIG. 6, a contact hole 260 is formed in the first ILD layer 110 and the etch stop layer 112. The contact hole 260 exposes a portion of the first source/drain region 101.

Figure 7:
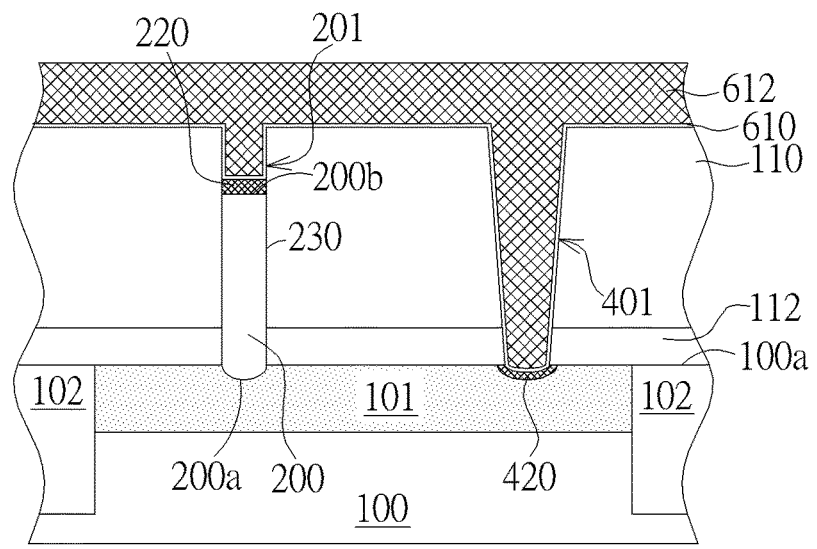

As shown in FIG. 7, after forming the contact hole 260 in the first ILD layer 110 and the etch stop layer 112, a first silicide layer 220 and a second silicide layer 420 are formed in the recess 250 and the contact hole 260, respectively. The first silicide layer 220 and the second silicide layer 420 may comprise titanium silicide (TiSix), but are not limited thereto. A barrier layer 610, such as titanium, titanium nitride, or a combination thereof, is deposited on the top surface of the first ILD layer 110 and in the recess 250 and the contact hole 260. A metal layer 612, such as a tungsten layer, is then deposited on the barrier layer 610. The recess 250 and the contact hole 260 are completely filled with the barrier layer 610 and the metal layer 612.

Figure 8:
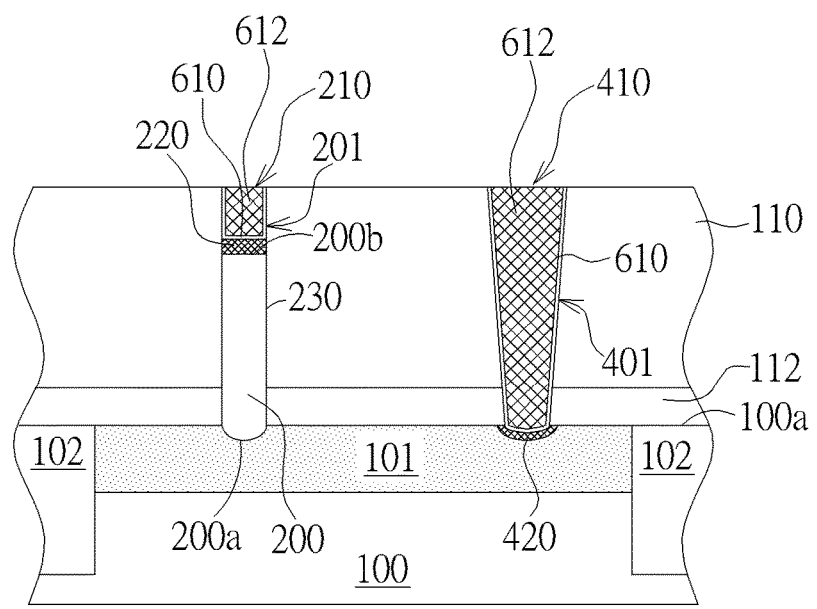

As shown in FIG. 8, a chemical mechanical polishing (CMP) process is performed to planarize the metal layer 612 and the barrier layer 610, so as to form a conductive layer 210 and a contact plug 410 in the recess 250 and the contact hole 260, respectively. The conductive layer 210 serves as a second source/drain region.

Figure 9:
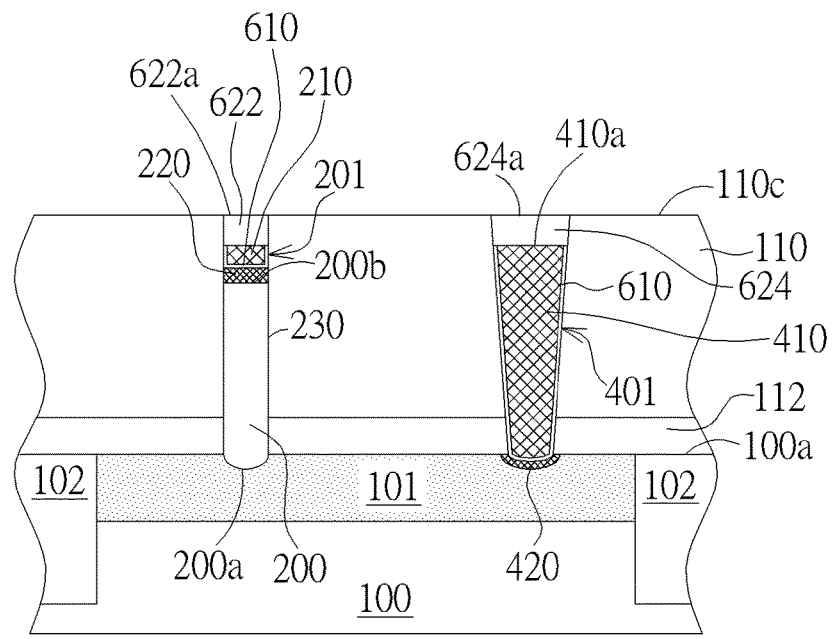

As shown in FIG. 9, the conductive layer 210 is capped with a first mask layer 622 and the contact plug 410 is capped with a second mask layer 624. A top surface 622a of the first mask layer 622, a top surface 624a of the second mask layer 624 and a top surface 110c of the first ILD layer 110 are coplanar. According to an embodiment of the present invention, the first mask layer 622 and the second mask layer 624 may be silicon nitride layers. The manner of forming the first mask layer 622 and the second mask layer 624 includes etching back the conductive layer 210 and the contact plug 410, depositing a dielectric layer, such as a silicon nitride layer, and applying a planarization process.

Figure 10:
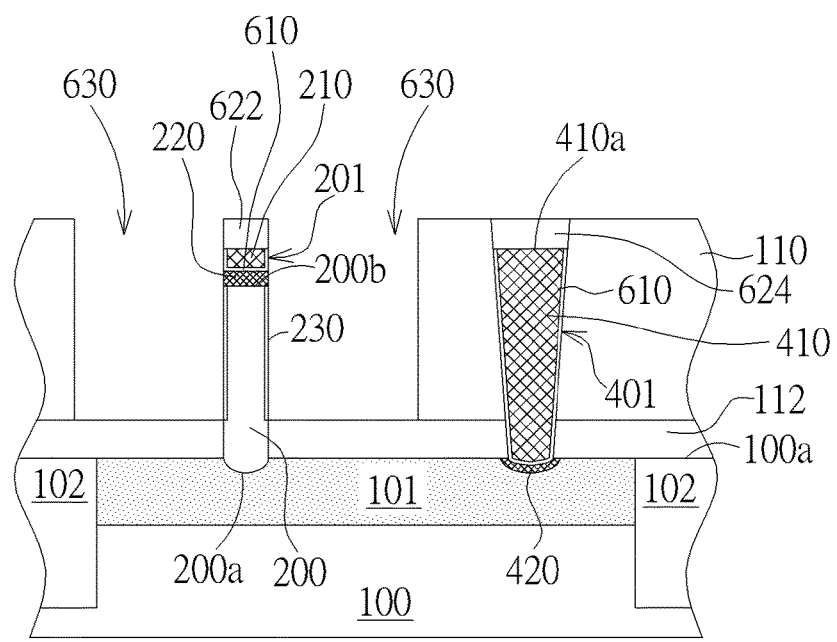

As shown in FIG. 10, a gate trench 630 surrounding the nanowire 200 is formed in the first ILD layer 110. According to an embodiment of the present invention, the depth of the gate trench 630 is approximately equal to the thickness of the first ILD layer 110. According to an embodiment of the present invention, the bottom surface of the gate trench 630 is the top surface of the etch stop layer 112. According to an embodiment of the present invention, optionally, a surface repair process, for example, in-situ steam generation (ISSG) process, may be performed on the surface of the nanowires 200 to form a silicon oxide surface layer 230.

Figure 11:
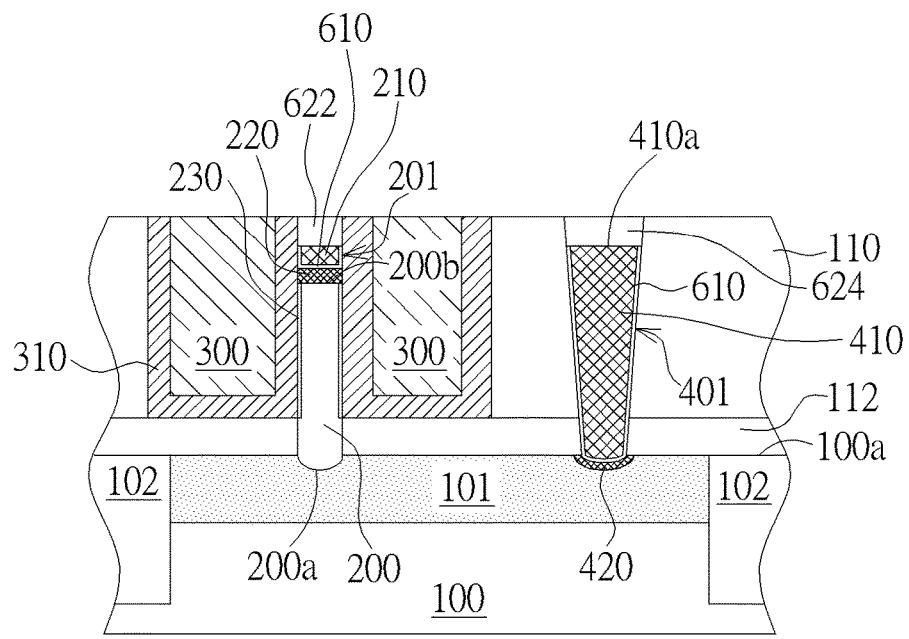

As shown in FIG. 11, a high dielectric constant (high-k) dielectric layer 310 is conformally deposited in the gate trench 630 as a gate dielectric layer, and a gate electrode 300 is formed on the high-k dielectric layer 310. The gate electrode 300 is then planarized by a chemical mechanical polishing process so that the gate electrode 300 is located only in the gate trench 630. At this point, the top surface of the gate electrode 300 is approximately flush with the top surface 110c of the first ILD layer 110.

Figure 12:
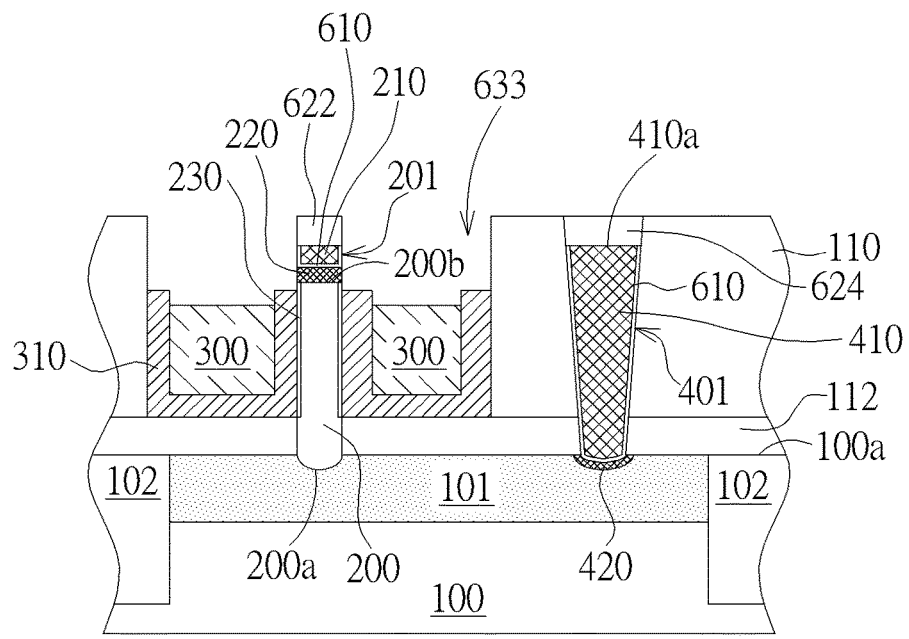

As shown in FIG. 12, the recess etching process of the gate electrode 300 is performed so that the top surface of the gate electrode 300 is lower than the top surface 110c of the first ILD layer 110. According to an embodiment of the present invention, the above-described recess etching process causes the top surface of the gate electrode 300 to be lower than the bottom of the first silicide layer 220. In addition, the upper end of the high-k dielectric layer 310 may be higher than the top surface of the gate electrode 300. At this point, an annular recessed area 633 is formed on the gate electrode 300.

Figure 13:
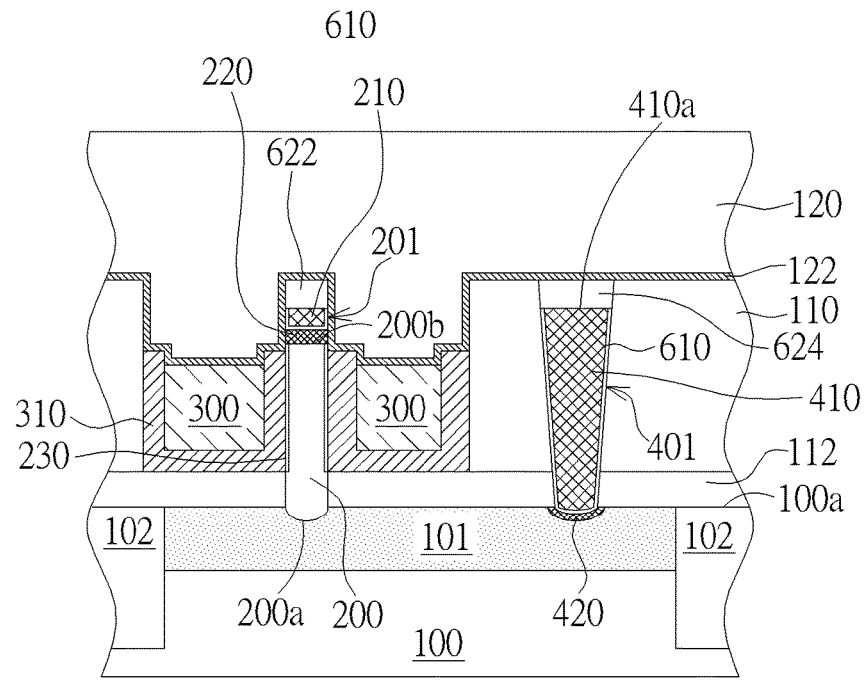

As shown in FIG. 13, a contact etch stop layer 122 is then deposited, conformally covering the top surface of the first ILD layer 110 and the annular recessed region 633. According to an embodiment of the present invention, the contact etch stop layer 122 is in direct contact with the first mask layer 622, the conductive layer 210, the first silicide layer 220, the second mask layer 624, and the first ILD layer 110.

As shown in FIG. 13, after the contact etch stop layer 122 is deposited on the top surface of the first ILD layer 110 and the annular recessed region 633, a second ILD layer 120 is deposited on the contact etch stop layer 122, such as a silicon oxide layer, and the second ILD layer 120 is filled into the annular recessed region 633.

Figure 14:
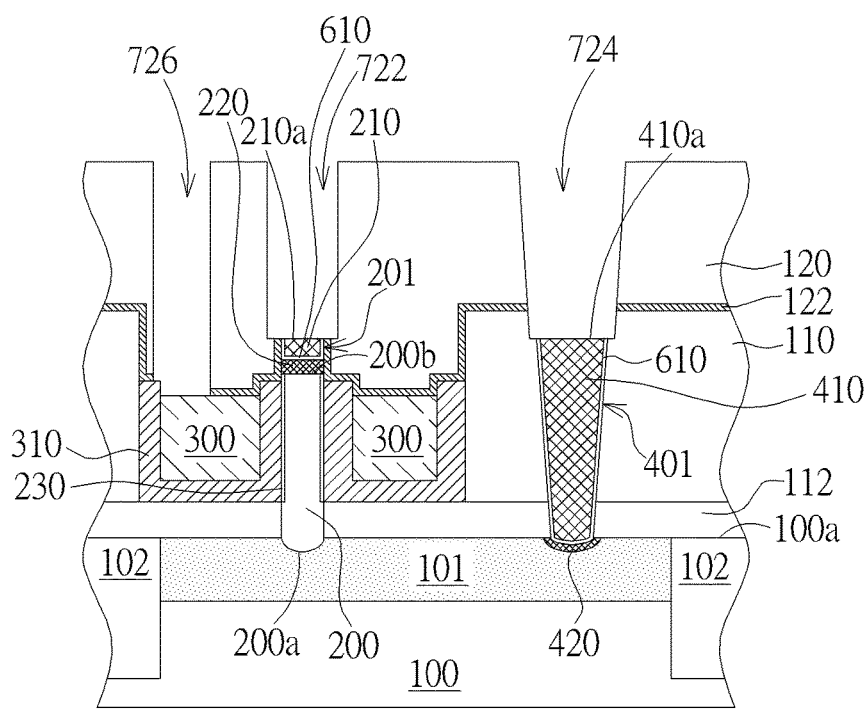

As shown in FIG. 14, after the second ILD layer 120 is deposited on the contact etch stop layer 122, a first contact hole etching process is performed, including etching the second ILD layer 120, the contact etch stop layer 122 and the first mask layer 622 so as to form a first metal-on-diffusion (MD) contact hole 722, which exposes the conductive layer 210, and etching the second ILD layer 120, the contact etch stop layer 122 and the second mask layer 624 so as to form a second MD contact hole 724, which exposes the contact plug 410. The first MD contact hole 722 and the second MD contact hole 724 have the same depth.

Subsequently, a second contact hole etching process is performed to etch the second ILD layer 120 and the contact etch stop layer 122 so as to form a metal-on-poly (MP) contact hole 726, which exposes the top surface of the gate electrode 300. The above-mentioned first and second contact hole etching processes may include a lithography process and an etching process.

Figure 15:
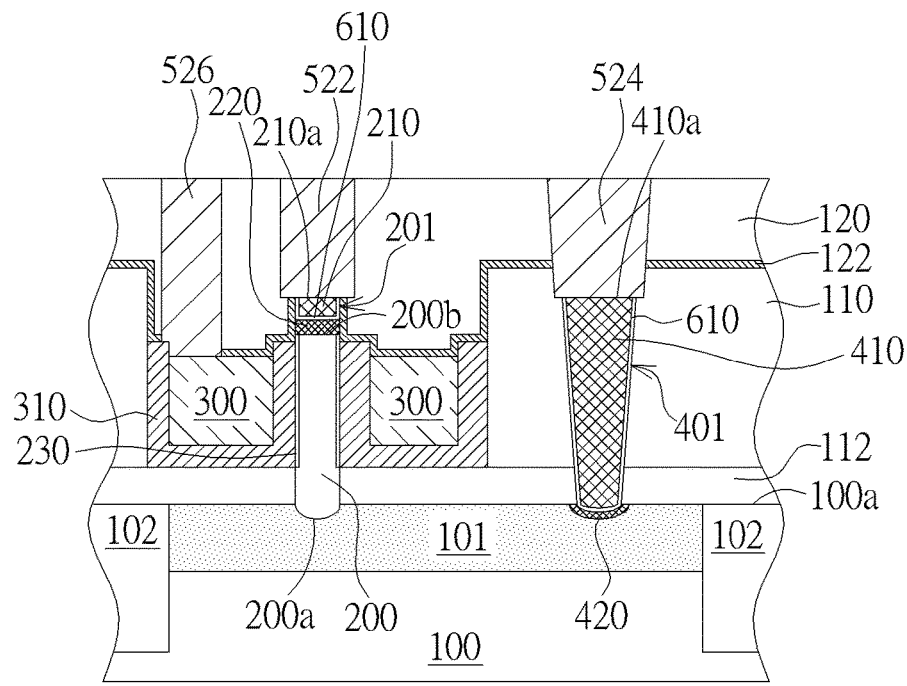

As shown in FIG. 15, a first MD contact element 522, a second MD contact elements 524, and a MP contact element 526 are formed in the first MD contact hole 722, the second MD contact hole 724, and the MP contact hole 726, respectively. The first MD contact element 522 is formed in the second ILD layer 120 and the contact etch stop layer 122, and is in direct contact with the conductive layer 210. The second MD contact element 524 is formed in the second ILD layer 120, the contact etch stop layer 122, and the first ILD layer 110, and is in direct contact with the contact plug 410. The MP contact element 526 is formed in the second ILD layer 120 and the contact etch stop layer 122 and directly contacts the gate electrode 300.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a vertical metal-oxide-semiconductor (MOS) transistor, comprising:

providing a substrate having therein a first source/drain region and a first inter-layer dielectric (ILD) layer covering the first source/drain region;

forming an opening in the first ILD layer so as to expose a portion of the first source/drain region;

epitaxially growing a nanowire in the opening;

recessing a top surface of the nanowire in the opening thereby forming a recess atop the nanowire;

forming a contact hole in the first ILD layer, wherein the contact hole exposes a portion of the first source/drain region;

forming a conductive layer in the recess and a contact plug in the contact hole, wherein the conductive layer acts as a second source/drain region;

capping the conductive layer with a first mask layer and capping the contact plug with a second mask layer, wherein a top surface of the first mask layer, a top surface of the second mask layer, and a top surface of the first ILD layer are coplanar;

forming a gate trench in the first ILD layer surrounding the nanowire; and forming a gate electrode in the gate trench.

2. The method according to claim 1, wherein the nanowire comprises a semiconductor material.

3. The method according to claim 1, wherein after forming the contact hole in the first ILD layer and before forming the conductive layer in the recess and the contact plug in the contact hole, the method further comprises:
   forming a first silicide layer in the recess and a second silicide layer in the contact hole; and
   depositing a barrier layer on the top surface of the first ILD layer and in the recess and the contact hole.

4. The method according to claim 3, wherein the barrier layer comprises Ti or TiN, or a combination thereof.

5. The method according to claim 1, wherein the conductive layer in the recess comprises tungsten layer.

6. The method according to claim 3, wherein after forming the gate electrode in the gate trench, the method further comprises:
   etching the gate electrode such that a top surface of the gate electrode is lower than a bottom of the first silicide layer, thereby forming an annular recessed region above the gate electrode.

7. The method according to claim 6, wherein after recessing the gate electrode, the method further comprising:
   depositing a contact etch stop layer conformally covering the top surface of the first ILD layer and the annular recessed region.

8. The method according to claim 7, wherein the contact etch stop layer is in direct contact with the first mask layer and the second mask layer.

9. The method according to claim 7, wherein after depositing the contact etch stop layer conformally covering the top surface of the first ILD layer and the annular recessed region, the method further comprises:
   depositing a second inter-layer dielectric (ILD) layer on the contact etch stop layer, wherein the second ILD layer fills into the annular recessed region.

10. The method according to claim 9, wherein after depositing the second ILD layer on the contact etch stop layer, the method further comprises:
   etching through the second ILD layer, the contact etch stop layer, and the first mask layer so as to form a first metal-on-diffusion (MD) contact hole exposing the conductive layer;
   etching through the second ILD layer, the contact etch stop layer, and the second mask layer so as to form a second MD contact hole exposing the contact plug, wherein the first MD contact hole and the second MD contact hole have the same depth; and
   etching through the second ILD layer and the contact etch stop layer so as to form a metal-on-poly (MP) contact hole exposing the top surface of the gate electrode.

* * * * *